United States Patent
Hsu et al.

(10) Patent No.: US 7,976,758 B2
(45) Date of Patent: Jul. 12, 2011

(54) METHOD OF MAKING A SHELL OF PORTABLE ELECTRONIC DEVICE

(75) Inventors: Che-Yuan Hsu, Taipei Hsien (TW); Cheng-Wen Su, Taipei Hsien (TW); Gang Huang, Shenzhen (CN); Yan-Min Wang, Shenzhen (CN); Qiang Wang, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 43 days.

(21) Appl. No.: 12/482,549

(22) Filed: Jun. 11, 2009

(65) Prior Publication Data

US 2009/0323263 A1    Dec. 31, 2009

(30) Foreign Application Priority Data

Jun. 27, 2008 (CN) .......................... 2008 1 0302407

(51) Int. Cl.
*B29C 45/14* (2006.01)
(52) U.S. Cl. ....................................... 264/267; 264/275

(58) Field of Classification Search .................. None
See application file for complete search history.

(56) References Cited

U.S. PATENT DOCUMENTS

| | | | | |
|---|---|---|---|---|
| 3,668,779 A | * | 6/1972 | Turner | 29/858 |
| 3,827,130 A | * | 8/1974 | Baumann | 29/421.1 |
| 4,312,824 A | * | 1/1982 | Mori et al. | 264/135 |
| 4,525,904 A | * | 7/1985 | Petri | 24/458 |
| 4,549,337 A | * | 10/1985 | Newell et al. | 29/527.4 |
| 5,531,950 A | * | 7/1996 | Kimura et al. | 264/135 |
| 5,551,141 A | * | 9/1996 | De'Ath et al. | 29/527.3 |
| 6,202,276 B1 | * | 3/2001 | Chuang | 29/421.1 |
| 6,593,524 B1 | * | 7/2003 | Toedtman | 174/363 |
| 6,694,594 B2 | * | 2/2004 | Chung et al. | 29/469.5 |
| 6,841,107 B2 | * | 1/2005 | Peters et al. | 264/135 |
| 7,021,112 B2 | * | 4/2006 | Nakada | 72/379.2 |
| 7,147,812 B2 | * | 12/2006 | Hammon | 264/135 |

FOREIGN PATENT DOCUMENTS

CN    101573008 A    11/2009
WO    WO 2005/10984    * 11/2005

* cited by examiner

*Primary Examiner* — Edmund H. Lee
(74) *Attorney, Agent, or Firm* — Steven M. Reiss

(57) ABSTRACT

A metal shell includes a metal cover and several latching portions disposed on the metal cover. The latching portions are made of plastic material, and integrally formed on the metal cover by an insert molding process. A method for making the metal shell is also described.

2 Claims, 2 Drawing Sheets

METHOD OF MAKING A SHELL OF PORTABLE ELECTRONIC DEVICE

TECHNICAL FIELD

The exemplary disclosure generally relates to a metal shell, and particularly to a metal shell with latching portions and a method for making the same.

DESCRIPTION OF RELATED ART

With the development of wireless communication and information processing technologies, portable electronic devices such as mobile phones and personal digital assistants (PDAs) are now in widespread use, and consumers may now enjoy the full convenience of high technology products almost anytime and anywhere.

Metal shells are widely used in portable electronic devices and, usually, a metal shell is detachably mounted on a main body of a portable electronic device. Generally, a typical metal shell may be made by stamping technology and includes an upper wall, a surrounding wall and some latching portions disposed on the upper wall or the surrounding wall thereof, so as to be securely mounted on the main body of the portable electronic device.

However, the latching portions formed by stamping technology lack elasticity, and are prone to deformation and wear after long periods of usage. Accordingly, the metal shell may easily and undesirably detach from the main body.

Therefore, there is room for improvement within the art.

BRIEF DESCRIPTION OF THE DRAWINGS

Many aspects of the present metal shell and method for making the same can be better understood with reference to the following drawings. The components in the drawings are not necessarily drawn to scale, the emphasis instead being placed upon clearly illustrating the principles of the present metal shell and method for making the same. Moreover, in the drawings, like reference numerals designate corresponding parts throughout the several views.

DETAILED DESCRIPTION

Figure 1:
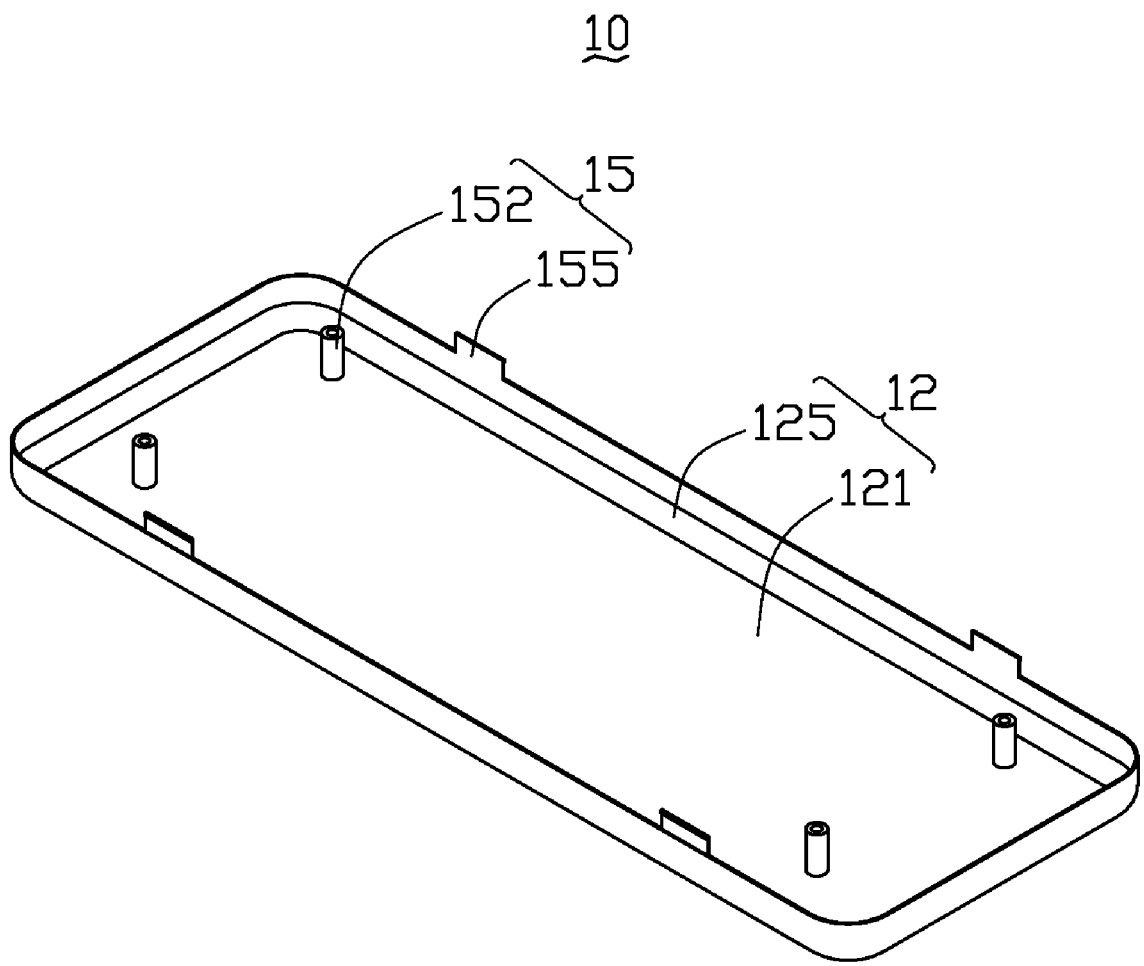
FIG. 1 shows a schematic, perspective view of a metal shell in accordance with an exemplary embodiment.
Figure 2:
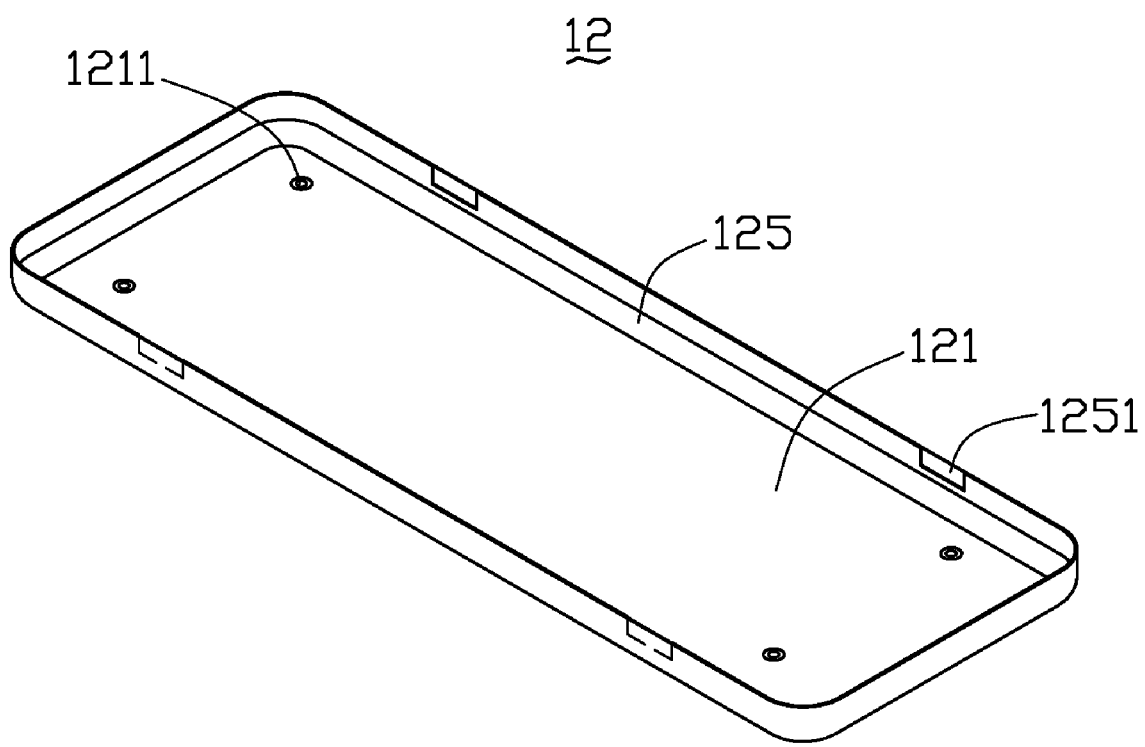
FIG. 2 shows a schematic, perspective view of a cover portion of the metal shell of FIG. 1.

The present embodiment discloses a metal shell which is suitable for a portable electronic device, such as mobile phone, personal digital assistant (PDA), and the like. Referring to FIG. 1 and FIG. 2, a metal shell 10 includes a metal cover 12 and several latching portions 15 disposed on the metal cover 12. The metal cover 12 is manufactured by stamping technology. The metal cover 12 includes an upper wall 121 and a surrounding wall 125 extending and bent from the peripheral edge (not labeled) of the upper wall 121. The upper wall 121 includes several blind holes 1211 defined in. In the present embodiment, there are four blind holes 1211 disposed adjacent to the four corners (not labeled) of the upper wall 121. The surrounding wall 125 includes several recesses 1251 defined therein. In the present embodiment, there are four recesses 1251 defined on two parallel and opposite sidewalls (not labeled) of the surrounding wall 125. Each of the two parallel and opposite sidewalls comprises two recesses 1251. The four recesses are fours substantially rectangular slots recess in an inner surface of the surrounding wall 125.

The latching portions 15 are made of plastic material such as polyvinylchloride (PVC) resin, polypropylene resin, polyethylene resin, polyethylene terephthalate (PET) resin, polycarbonate (PC), nylon resin, polyvinyl formal resin, alkyd resin, polyimide resin and etc. The latching portions 15 are formed on the metal cover 12 by an insert molding process. In the present embodiment, the latching portions 15 include four first latching pieces 152 and four second latching pieces 155. The four first latching pieces 152 are substantially hollow cylinders and respectively protrude upwardly from the corresponding four blind holes 1211 of the upper wall 121. The four second latching pieces 155 are substantially rectangular and protrude outwardly from the corresponding four recesses 1251 of the surrounding wall 125 respectively.

A method for manufacturing the metal shell 10 includes following steps.

Provide a metal cover 12, the metal cover 12 includes an upper wall 121 and a surrounding wall 125 extending and bent from the peripheral edge of the upper wall 121. The upper wall 121 includes several blind holes 1211 defined in the upper wall 121 thereof and several recesses 1251 defined in the surrounding wall 125 thereof.

Provide a mold, put the metal cover 12 into the mold, and inject plastic material into the mold to form the first latching pieces 152 and the second latching pieces 155 within the corresponding blind holes 1251 and the recesses 1251 respectively by insert molding process.

It is to be understood, however, that even though numerous characteristics and advantages of the present invention have been set forth in the foregoing description, with details of the structure and function of the present invention, the disclosure is illustrative only, and changes may be made in detail, especially in matters of shape, size, and arrangement of parts within the principles of present invention to the full extent indicated by the broad general meaning of the terms in which the appended claims are expressed.

What is claimed is:

1. A method for making a shell of portable electronic device comprising:
   providing a metal cover including an upper wall and a surrounding wall extending and bent from the upper wall, the upper wall defining a plurality of blind holes, the surrounding wall defining a plurality of recesses;
   providing a mold; and
   putting the metal cover into the mold;
   injecting plastic material into the mold, the plastic material combined into the blind holes of the metal cover to form a plurality of first latching pieces, the first latching pieces being substantially hollow cylinders respectively protruding outwardly from the upper wall, the plastic material combined into the recesses to form a plurality of second latching pieces, the second latching pieces being substantially rectangular and respectively protruding outwardly from the surrounding wall.

2. The method for making the shell as claimed in claim 1, wherein the latching portions are made of polyvinylchloride resin, polypropylene resin, polyethylene resin, polyethylene terephthalate resin, polycarbonate, nylon resin, polyvinyl formal resin, alkyd resin or polyimide resin.

* * * * *